(12) United States Patent
Kim et al.

(10) Patent No.: US 7,235,991 B2
(45) Date of Patent: Jun. 26, 2007

(54) INSERT HAVING INDEPENDENTLY MOVABLE LATCH MECHANISM FOR SEMICONDUCTOR PACKAGE

(75) Inventors: Jin-Woog Kim, Asan-si (KR); Seok-Ho Jin, Anyang-si (KR); Seok-Young Yoon, Cheonan-si (KR); Se-Un Lee, Cheonan-si (KR); Hyeck-Jin Jeong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/391,381

(22) Filed: Mar. 29, 2006

(65) Prior Publication Data

US 2007/0075702 A1 Apr. 5, 2007

(30) Foreign Application Priority Data

Sep. 30, 2005 (KR) .................... 10-2005-0092048

(51) Int. Cl.
*G01R 31/02* (2006.01)
*G01R 31/28* (2006.01)

(52) U.S. Cl. .................... 324/755; 324/158.1
(58) Field of Classification Search ............ 324/755, 324/765; 439/70–73, 330
See application file for complete search history.

(56) References Cited

U.S. PATENT DOCUMENTS 6,873,169 B1 * 3/2005 Ham et al. .................. 324/755

(Continued)

FOREIGN PATENT DOCUMENTS

JP         2002-367747        12/2002

(Continued)

Primary Examiner—Ha Tran Nguyen
Assistant Examiner—Roberto Velez
(74) Attorney, Agent, or Firm—Harness, Dickey & Pierce, P.L.C.

(57) ABSTRACT

In an example embodiment, an insert having an independently movable latch mechanism for loading a semiconductor package may include an insert body having a pocket, latch units installed at opposite sides of the pocket, and a press plate elastically installed above the insert body. The latch units prevent a loaded semiconductor package from escaping out of the pocket. The press plate may operate the latch unit by movement relative to an upper surface of the insert body. Each latch may be movably connected to the insert body such that a first end of the latch is rotatable around a fixed shaft pin. A second end of the latch may be movable into and out of the pocket. The latch may have a front surface slanted downwards towards the center of the pocket and have a guide hole near the back surface, opposite the front surface. A button connected to the latch by a moving shaft pin may be elastically coupled between the latch and the press plate, the button projecting upwards from the insert body and converting the movement of the press plate into rotational movement of the latch by causing the moving shaft pin to move along the guide hole. The movement of the shaft pin rotates the latch about the fixed shaft pin. The guide hole includes a guide hole correction space that permits movement of the moving shaft pin into the guide hole correction space such that the latch rotates about the fixed shaft pin independent of the movement of the press plate. An elastic body may be located between a back of the latch having the guide hole and the insert body near to the side of the latch, such that the elastic body applies an elastic force to a latch so as to cause the latch to protrude into the pocket.

19 Claims, 17 Drawing Sheets

U.S. PATENT DOCUMENTS

2006/0192583 A1* 8/2006 Ham et al. .................. 324/765

FOREIGN PATENT DOCUMENTS

| | | |
|---|---|---|
| JP | 2004-079227 | 3/2004 |
| KR | 1998-69436 | 10/1998 |
| KR | 20-0389391 | 7/2005 |

* cited by examiner

INSERT HAVING INDEPENDENTLY MOVABLE LATCH MECHANISM FOR SEMICONDUCTOR PACKAGE

PRIORITY STATEMENT

This U.S. non-provisional application claims benefit of priority under 35 U.S.C.§119 from Korean Patent Application No. 2005-92048, filed on Sep. 30, 2005, the entire contents of which are incorporated herein by reference.

BACKGROUND OF THE INVENTION

1. Field of the Invention

The present invention relates generally to an insert for loading a semiconductor package.

2. Description of the Related Art

During semiconductor package manufacturing processes, semiconductor packages generally undergo various tests in terms of electrical and functional properties to ensure reliability. In a semiconductor package test process, a handler serving as a semiconductor package handling apparatus is typically used to transport manufactured semiconductor packages to a testing apparatus and to sort the tested semiconductor packages.

The handler conveys a plurality of semiconductor packages to the testing apparatus and performs a test operation by electrically contacting each semiconductor package through a test socket to a test head. The handler brings each tested semiconductor package out from the test head and sorts the tested semiconductor package according to test results thereof.

Specifically, the handler conveys a test tray to the testing apparatus to proceed with the package test process. The test tray includes a plurality of inserts each holding a semiconductor package; for example, for loading ball grid array (BGA) packages, among the various other possible types of semiconductor packages.

A conventional insert for holding a semiconductor package has been disclosed in Korean Utility Model Gazette No. 389391. As shown in FIG. 1, the insert 200 disclosed in Korean Utility Model Gazette No. 389391 comprises an insert body 110 having a pocket 112 into which a semiconductor package is inserted, latches 130 installed at the insert body 110 for fixing the semiconductor package inserted into the insert body 110, and a press plate 160 installed above the insert body 110 to open and close the latches 130. Buttons 140 are installed between the latches 130 and press plate 160 to open and close the latches 130 in the pocket 112.

In the insert 200 having the above-described configuration, as shown in FIGS. 2A to 2C, a pressurizing portion 134 of each latch 130 has a slanted surface protruding into the pocket 112. When the pocket 112 is opened, the latches 130 retract into the insert body 110. If a semiconductor package 170a is caught on one of the upper ends of the latches 130 while the semiconductor package 170a is being loaded in the pocket 112, the semiconductor package 170a can be stably loaded on a load base 112b of the pocket 112 without damage to the semiconductor package 170a and latches 130. By applying a force with a pusher 180 to directly open the corresponding latch 130, the semiconductor package 170a can be loaded on the load base 112b of the pocket 112, and establish a stable electrical contact between the semiconductor package 170a and a test socket 190.

However, in the case where a semiconductor package 170a is caught on one of the pressurizing portions 134 of the latches 130, in order to directly open the corresponding latch 130 to load the semiconductor package 170a on the load base 112b of the pocket 112, a force must be applied from the pusher 180 to the semiconductor package 170a that is strong enough to push downwards both the latch 130 and a button 140, which is connected to the latch 130. Consequently, this force applies significant mechanical stress to the semiconductor package 170a caught on the pressurizing portion 134 of the latch 130.

If the semiconductor package 170a is a hard type, for example, having an epoxy-based resin encapsulant, the semiconductor package 170a can be pushed without damage to open the latch 130 and be loaded on the load base 112b of the pocket 112. However, if the semiconductor package 170a is a soft BGA package, for example, a package having an outwardly exposed semiconductor chip with a circuit substrate made of a flexible tape substrate or a resin encapsulant made of soft silicone-based resin, the semiconductor package 170a may be damaged as the pusher 180 pushes it downwards.

SUMMARY OF THE INVENTION

The following invention is directed to an insert having an independently movable latch mechanism for semiconductor packages.

In an example embodiment, an insert having an independently movable latch mechanism for loading a semiconductor package may include an insert body having a pocket, latch units installed at opposite sides of the pocket, and a press plate elastically installed above the insert body. The latch units prevent a loaded semiconductor package from escaping out of the pocket. The press plate may operate the latch unit by movement relative to an upper surface of the insert body. Each latch may be movably connected to the insert body such that a first end of the latch is rotatable around a fixed shaft pin. A second end of the latch may be movable into and out of the pocket. The latch may have a front surface slanted downwards towards the center of the pocket and have a guide hole near the back surface, opposite the front surface. A button connected to the latch by a moving shaft pin may be elastically coupled between the latch and the press plate, the button projecting upwards from the insert body and converting the movement of the press plate into rotational movement of the latch by causing the moving shaft pin to move along the guide hole. The movement of the shaft pin rotates the latch about the fixed shaft pin. The guide hole includes a guide hole correction space that permits movement of the moving shaft pin into the guide hole correction space such that the latch rotates about the fixed shaft pin independent of the movement of the press plate. An elastic body may be located between a back of the latch having the guide hole and the insert body near to the side of the latch, such that the elastic body applies an elastic force to a latch so as to cause the latch to protrude into the pocket.

In one example embodiment, the guide hole correction space extends towards the pocket from a site where the moving shaft pin is located in the state where no pressurizing force is applied to the press plate.

In an alternate embodiment, the guide hole correction space may extend from the entire edge of the guide hole opposite the pocket.

DETAILED DESCRIPTION OF EXAMPLE EMBODIMENTS OF THE INVENTION

Hereinafter, example embodiments of the present invention will be described in detail with reference to the accompanying drawings.

Figure 1:
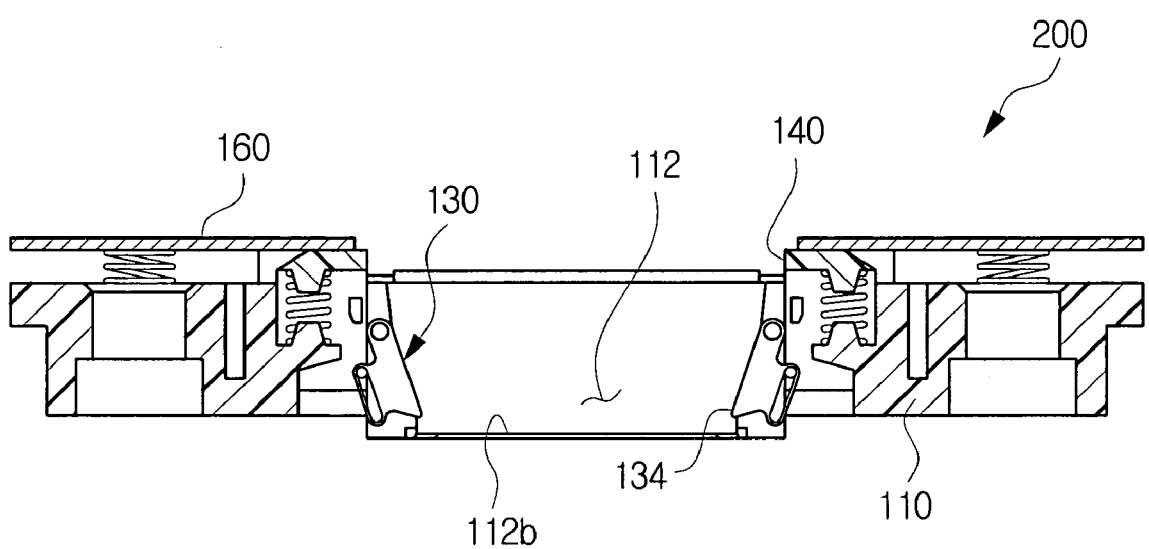
FIG. 1 is a sectional view of a conventional insert for loading a semiconductor package.
Figure 2A:
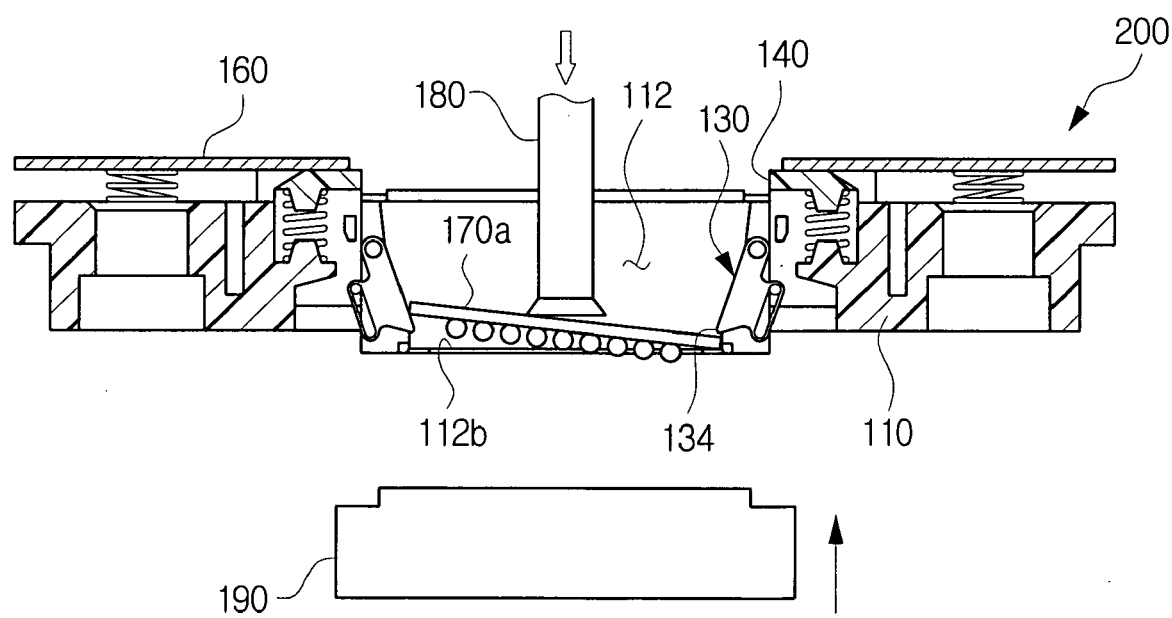
FIGS. 2A to 2C are sectional views illustrating steps of loading a semiconductor package, misloaded in a pocket of the insert of FIG. 1, on a load base of the pocket and electrically contacting the semiconductor package with a test socket.
Figure 2B:
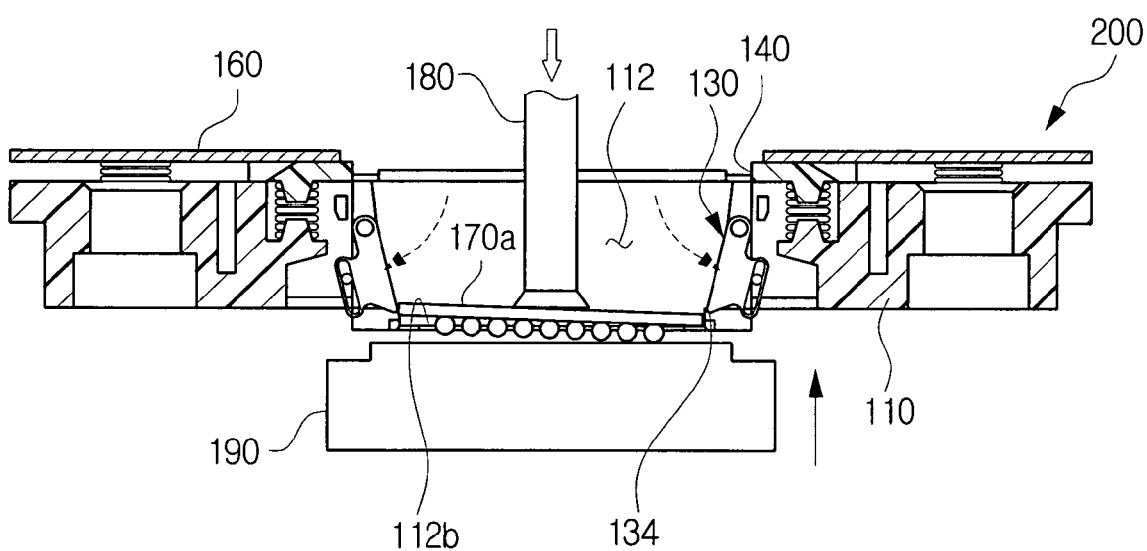
Figure 2C:
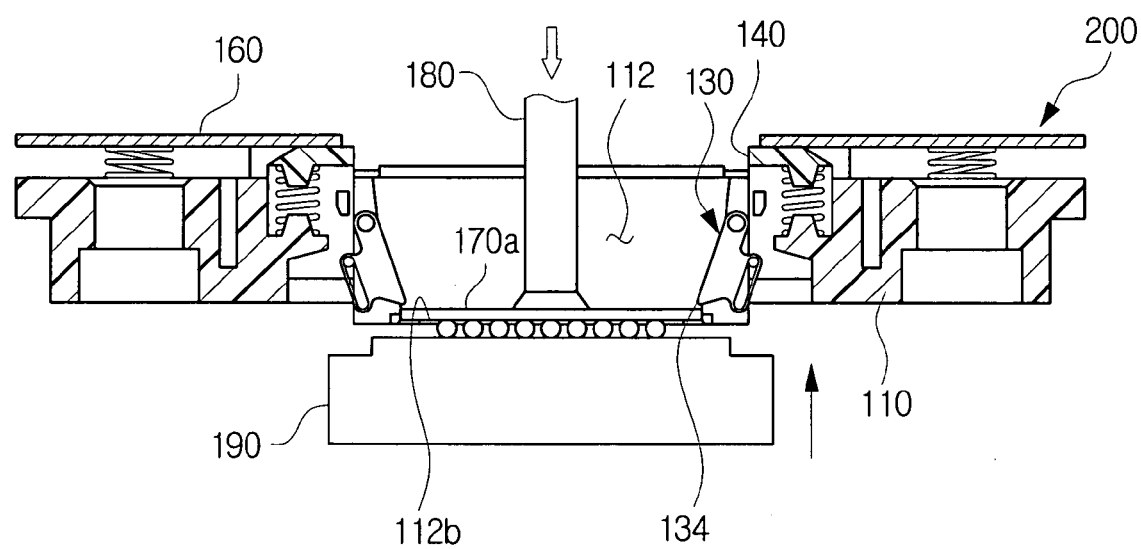
Figure 3:
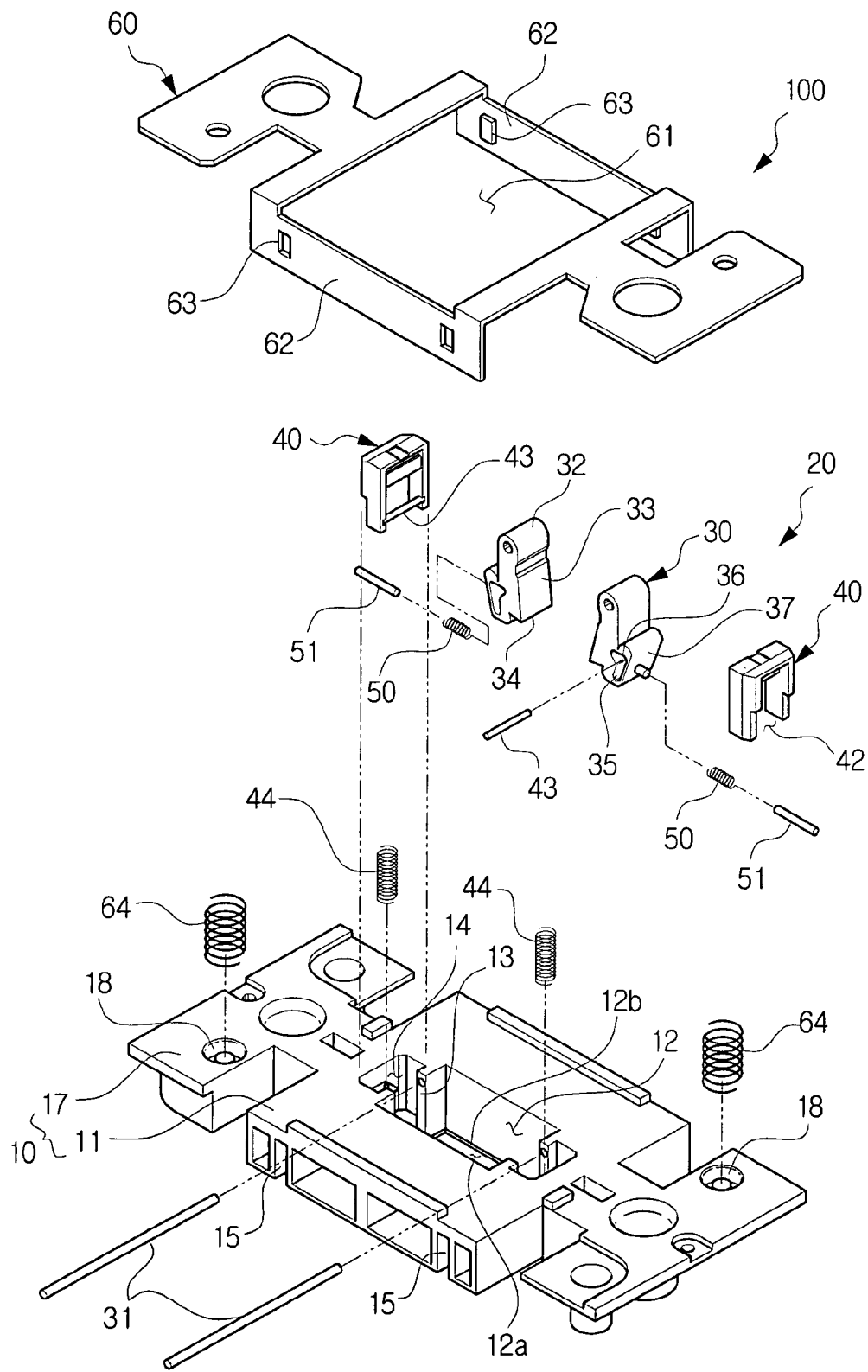
FIGS. 3 and 4 are exploded perspective views of an insert having an independently movable latch mechanism for loading a semiconductor package according to an example embodiment of the present invention.
Figure 4:
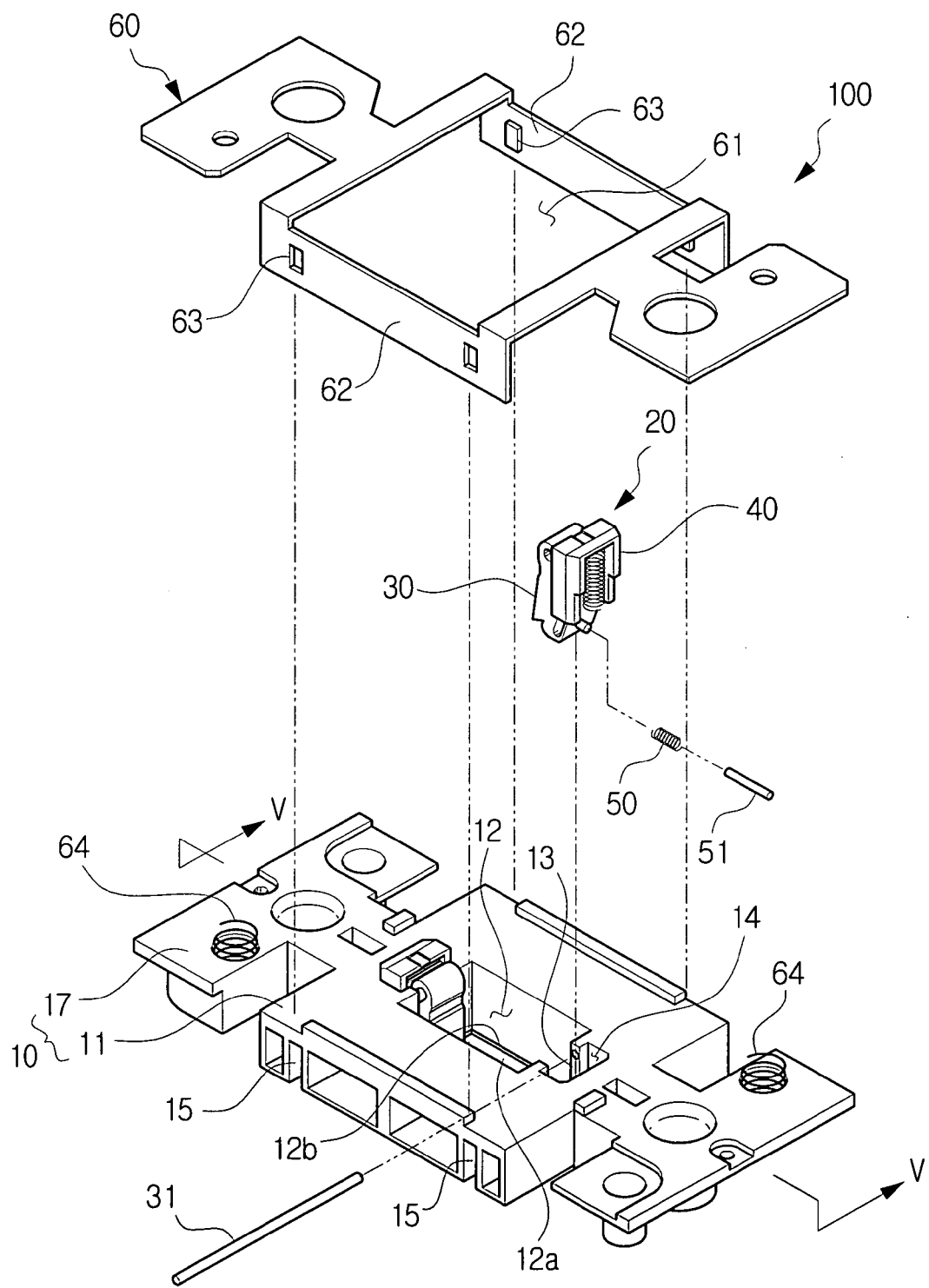
Figure 5A:
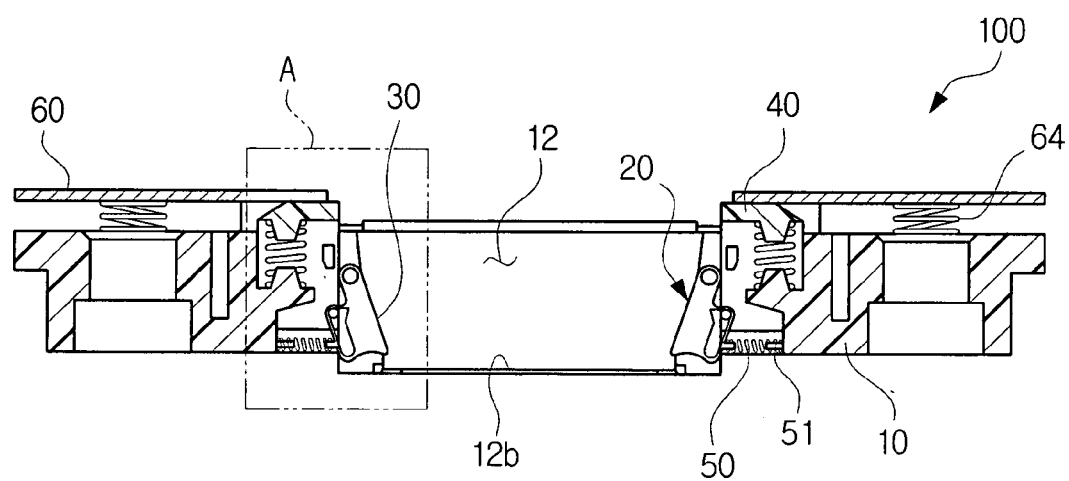
FIG. 5A is a sectional view of the insert taken along the line V—V of FIG. 4.
Figure 5B:
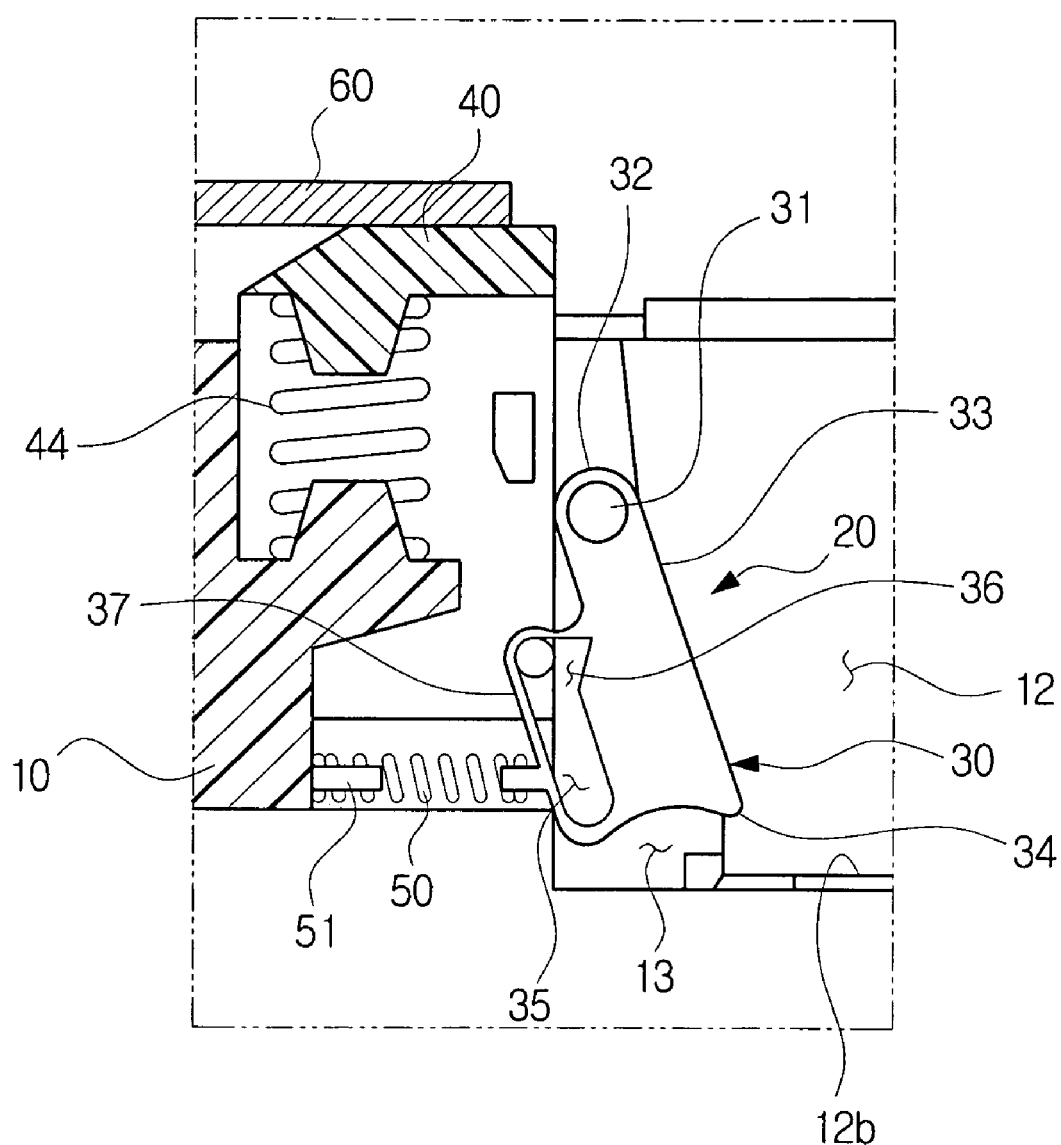
FIG. 5B is an enlarged view of a latch portion 'A' of the insert of FIG. 5A.

A first embodiment of the present invention will be described with respect to FIGS. 3–5B. FIGS. 3 and 4 are exploded perspective views of an insert 100 having an independently movable latch mechanism 30 for loading a semiconductor package according to an example embodiment of the present invention. FIG. 5A is a sectional view of the insert 100 taken along the line V—V of FIG. 4, and FIG. 5B is an enlarged view of a latch portion 'A' of the insert 100 shown in FIG. 5A.

Referring to FIGS. 3 to 5B, the insert 100 according to the example embodiment of the present invention may include an insert body 10 having a pocket 12 formed at a central area to hold and load a semiconductor package, latch units 20 installed at two opposite sides of the pocket 12 which may prevent the loaded semiconductor package from escaping out of the pocket 12, and a press plate 60 elastically installed on the insert body 10 which may move up and down relative to the upper surface of the insert body 10 to operate the latch units 20 and open/close the pocket 12 so as to load/unload the semiconductor package.

The insert body 10 includes a first body portion 11, and second body portions 17 extending from opposite sides of the first body portion 11.

The pocket 12 is formed in the first body portion 11. A rectangular contact opening 12a may be formed at the center and bottom of the pocket 12. A load base 12b, for loading the semiconductor package, may be formed around the contact opening 12a. Electrical connections between the semiconductor package loaded in the pocket 12 and a test socket may be formed by mechanical contact through the contact opening 12a.

In the first body portion 11, installation grooves in which the respective latch units 20 are installed may be formed near to the corresponding second body portions 17. Each installation groove may include a latch installation groove 13 connected to the pocket 12, and a button installation groove 14 connected to the latch installation groove 13.

A pair of stopping grooves 15 may be formed in opposite outer sides of the first body portion 11.

A spring groove 18 may be formed on the upper portion of each second body portion 17, and may serve to contain a first spring 64 sandwiched between the insert body 10 and press plate 60. The spring grooves 18 may be placed diagonally in the insert body 10.

The press plate 60 includes an opening portion 61, which may be larger than the pocket 12 in the first body portion 11, and guide sections 62 corresponding to the outer sides of the first body portion 11. As mentioned above, the first body portion 11 may include the stopping grooves 15. Each of the guide sections 62 may have a pair of stopping protrusions 63, which are coupled to the corresponding stopping grooves 15 of the first body portion 11 and can be moved, up and down, along the corresponding stopping grooves 15. The first springs 64 are sandwiched between the press plate 60 and the spring grooves 18 of the second body portions 17. A gap of a predetermined range may be maintained between the press plate 60 and the upper surface of the insert body 10 through the elastic forces of the first springs 64 and stopping mechanisms of the stopping grooves 15, which may be coupled to the corresponding stopping protrusions 63.

Each of the latch units 20 may include a latch 30 installed in the corresponding latch installation groove 13, a button 40 linked with the associated latch 30 and installed in the corresponding button installation groove 14, and an elastic body such as a third spring 50, which may supply an elastic force to the latch 30 for independent opening and closing of the latch 30.

Referring to FIG. 4, the latch 30 may be installed in the corresponding latch installation groove 13 such, that one end of the latch 30 is rotatable around a fixed shaft pin 31 and the other end is movable to and from the inside of the pocket 12 at a lower portion of the pocket 12. The front surface 33 of the latch 30 may be slanted downwards towards the center of the pocket 12. A long guide hole 35 may be formed near to the back surface, which is opposite to the front surface 33. The latch 30 may include a fixing portion 32 which may be coupled to the fixed shaft pin 31, a pressurizing portion 34 for opening and closing the pocket 12 that may extend from the fixing portion 32, and a guide portion 37 that may have the guide hole 35 and a guide hole correction space 36 at the back of the pressurizing portion 34. The gap between the pressurizing portion 34 of the latch 30 projecting towards the pocket 12 and the load base 12b of the pocket 12 may be greater than the thickness of a semiconductor package to be installed in the pocket 12.

The button 40 may be connected to the associated latch 30 through a moving shaft pin 43 which is rotatably located in the guide hole 35. The moving shaft pin 43 may be parallel to the corresponding fixed shaft pin 31 and may be positioned behind and below the fixed shaft pin 31. The button 40 may be elastically coupled between the latch 30 and the press plate 60, and project upwards from the insert body 10 to convert movement of the press plate 60 into rotational movement of the latch 30. A second spring 44 may be disposed between the button 40 and the bottom of the corresponding button installation groove 14, causing elastic up-down movement of the button 40. The second spring 44 may be elastically restricted by the fixed shaft pin 31. Fixed shaft pin 31 may couple the latch 30 to the insert body 10. A rotation space 42 may be provided in the button 40 to permit the latch 30 to rotationally move along the moving shaft pin 43. The moving shaft pin 43 of the button 40 may move along the guide hole 35 of the latch 30, causing latch 30 to rotationally moves between the rotation space 42 of the button 40, the latch installation groove 13 and the pocket 12.

The first and second springs 64 and 44 may be compression coil springs. The first springs 64 may be auxiliary springs for aiding the second springs 44. The Second springs 64 may be embedded in the respective buttons 40 to upwardly push the press plate 60 in a stable manner. Although the first springs 64 are illustrated to be used in the present embodiment, they may be not installed if the second springs 44 have an elastic force sufficient to push the press plate 60 upwards.

Referring to FIG. 5A, to open and close the pocket 12 by rotational movement of the pressurizing portion 34 near to the load base 12b of the pocket 12, the pressurizing portion 34 is arranged below the moving shaft pin 43 such that the pressurizing portion 34, fixed shaft pin 31, and moving shaft pin 43 may be coupled to form a given angle with the fixed shaft pin 31 at the apex.

Referring to FIG. 5B, a third spring 50 may be installed between the side of the guide portion 37 having the guide hole 35 and a spring installation groove. The spring installation groove may extend inwards from the latch installation groove 13 facing the side of the guide portion 37. Third spring 50 may exert an elastic force on the latch 30, causing the pressurizing portion 34 of the latch 30 to protrude into the pocket 12. One end of the third spring 50 may be located on a guide pin 51 inserted into the spring installation groove, and the other end may be installed in contact with the side of the guide portion 37. The third spring 50 may be a coil spring such as a compression coil spring or torsion coil spring.

By applying pressure to the pressurizing portion 34 of the latch 30, it is possible to operate the latch 30 independently from the related button 40. In the state when no pressurizing force is applied to the press plate 60, the latch 30 may have a guide hole correction space 36 extending towards the pocket 12 from the site of the guide hole 35 where the moving shaft pin 43 is located in the state when no pressurizing force is applied to the press plate 60.

The guide hole 35 may have a long slanted oval shape corresponding to the front surface 33 of the latch 30, and may be longer than a moving distance of the moving shaft pin 43. When no pressurizing force is applied to the press plate 60, the moving shaft pin 43 is in contact with the upper end of the guide hole 35. The guide hole correction space 36 may extend from the upper end of the guide hole 35 towards the pocket 12. In this embodiment, the guide hole correction space may have a triangular shape.

The size of the guide hole correction space 36 is large enough to permit the latch 30 to be independently movable, without interference from the moving shaft pin 43. The size of the guide hole correction space 36 may also be large enough to permit the pressurizing portion 34 of the latch 30 to be pressed into the latch installation groove 13.

The third spring 50 may have an elastic force strong enough to protrude the pressurizing portion 34 of the latch 30 into the pocket 12, and a modulus of elasticity which is sufficient to push the latch 30 to load a semiconductor package caught on the pressurizing portion 34 of the latch 30 on the load base 12b of the pocket 12 without damaging the semiconductor package. The third spring 50 may have a modulus of elasticity smaller than that of the second spring 44, which may be coupled to the button 40.

Referring to FIGS. 6A to 6D, a description is given of the steps for loading a semiconductor package 70 in the insert 100 having the above-described configuration according to the example embodiment of the present invention.

Figure 6A:
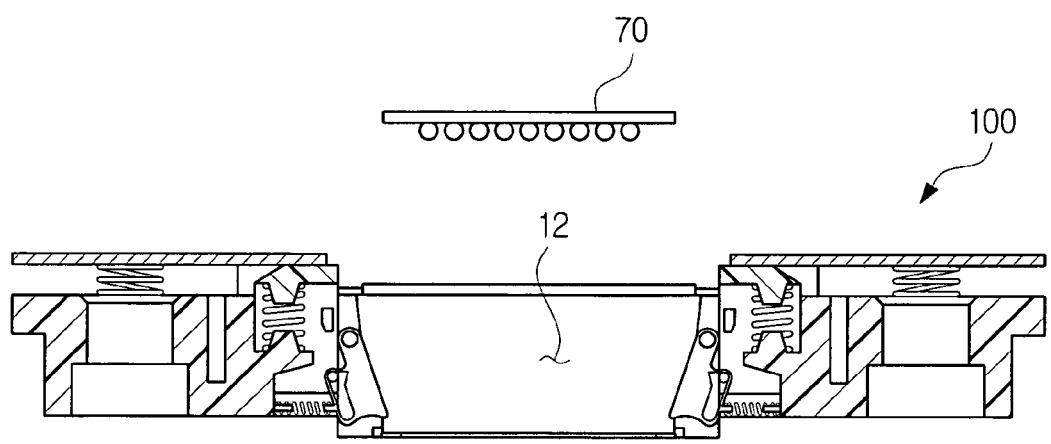
FIGS. 6A to 6D are sectional views illustrating steps of loading a semiconductor package in a pocket of the insert of FIG. 5A.

Firstly, as shown in FIG. 6A, the semiconductor package 70 may be transported to the insert 100 by a transport mechanism.

Figure 6B:
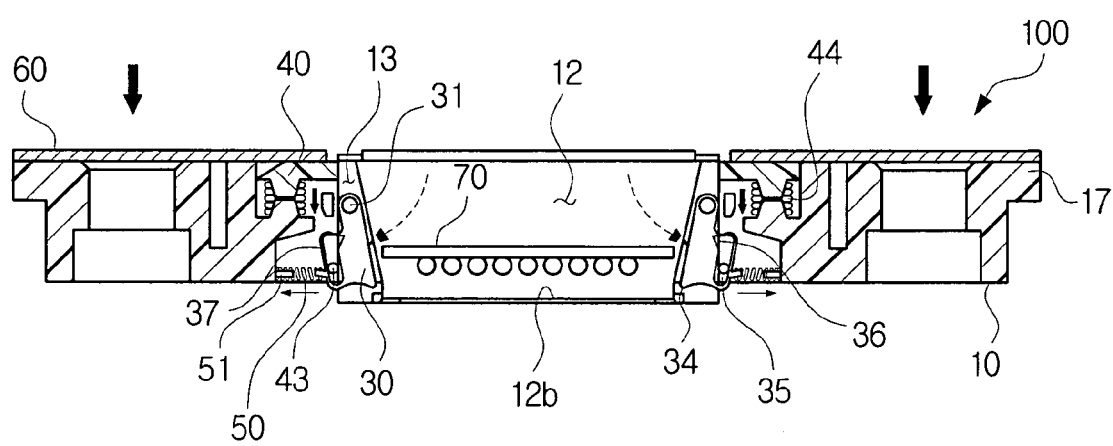

As shown in FIG. 6B, a robot of the transport mechanism may push down the press plate 60, causing each latch 30 to retract from the pocket 12 into the corresponding latch installation groove 13, thereby opening the pocket 12. The robot of the transport mechanism may push down parts of the press plate 60, corresponding to the second body portions 17, to open the pocket 12. The semiconductor package 70 may then be inserted into the pocket 12 to a particular depth.

When the press plate 60 is pushed down and descends to the upper surface of the insert body 10, each button 40 also descends. While the press plate 60 and each button 40 descend, the first and second springs 64 and 44 are compressed, accumulating elastic forces. If each button 40 descends, the pressurizing portion 34 of the corresponding latch 30 is rotatably moved into the corresponding latch installation groove 13.

More specifically, when each button 40 descends due to the pressure of the press plate 60, the corresponding moving shaft pin 43 moves from the upper end of the corresponding guide hole 35 towards the lower end, causing the corresponding latch 30 to rotate around the associated fixed shaft pin 31, and the pressurizing portion 34 of the latch 30 projects into pocket 12 to retract into the corresponding latch installation groove 13. The moving shaft pin 43 may move along the guide hole 35 rather than towards the corresponding guide hole correction space 36 due to the elastic force of the third spring 50 pushing the side of the guide portion 37.

Figure 6C:
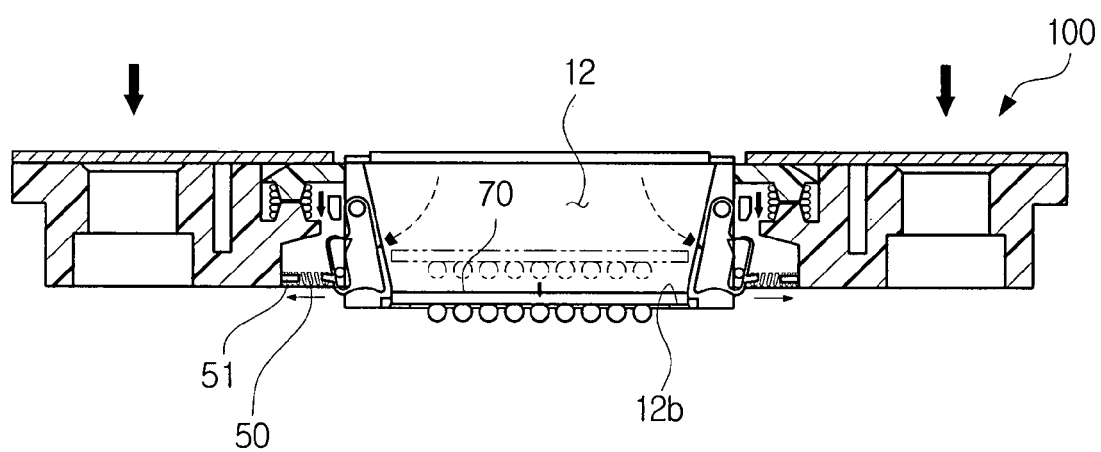

Next, as shown in FIG. 6C, the semiconductor package 70 transported by the transport mechanism may be loaded through gravity onto the load base 12b of the opened pocket 12.

Figure 6D:
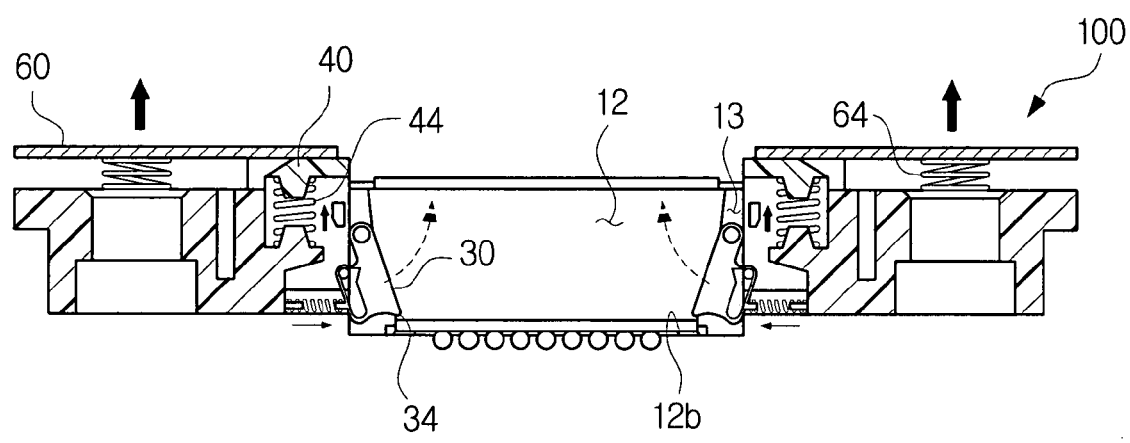

Finally, as shown in FIG. 6D, when the robot of the transport mechanism ascends and is detached from the press plate 60, the pressure applied to the press plate 60 is removed. The press plate 60 and each button 40 may then return to their respective original states due to the accumulated elastic forces of the first and second springs 64 and 44. Each latch 30 may protrude from the corresponding latch installation groove 13 into the pocket 12 and over the semiconductor package 70 loaded on the load base 12b of the pocket 12, preventing the semiconductor package 70 from escaping out of the pocket 12.

Figure 7A:
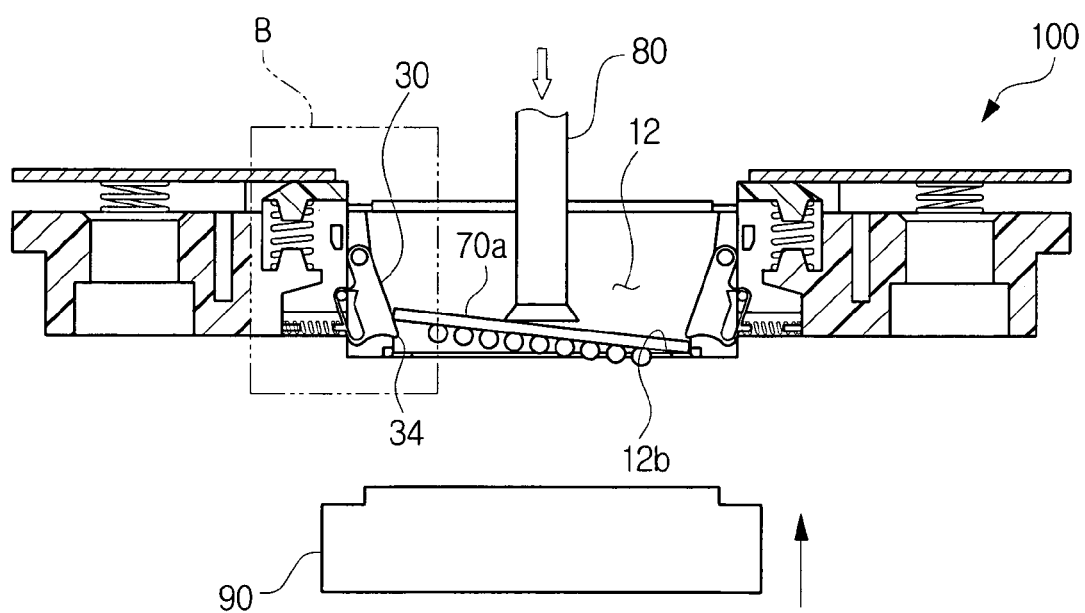
FIGS. 7A to 7D are sectional views illustrating steps of loading a semiconductor package, misloaded in the pocket of the insert of FIG. 5A, on a load base of the pocket and electrically contacting the semiconductor package with a test socket.

However, a semiconductor 70a may be misloaded, because the size tolerance allowed for by the load base 12b of the pocket 12 is not large relative to the size of a semiconductor package or because the semiconductor package is loaded on the load base 12b through gravity. For example, the semiconductor package may be tilted to one side on the load base 12b of the pocket 12, as shown in FIG. 7A. When the semiconductor package 70a is misloaded, the pressurizing portion 34 of a latch 30 protruding into the pocket 12 may protrude under a part of the semiconductor package 70a.

As will be recalled, in test processes, a test tray including an insert having a loaded semiconductor package may be supplied by a handler to a testing apparatus, and the semiconductor package may be pushed by a pusher towards a test socket to stably maintain electrical contact between the semiconductor package and test socket. If the insert has a correctly loaded semiconductor package, the pressurizing force from the pusher may not be transferred to any latch. However, if the insert has a misloaded semiconductor package, the pressurizing force applied by the pusher may be transferred to the corresponding latch.

Referring to FIGS. 7A to 7D, a description is hereinafter given of an example method of correctly loading a misloaded semiconductor package in an example embodiment. In an example embodiment, a misloaded semiconductor package 70a on the load base 12b of the pocket 12 may use a pressurizing force applied by a pusher 80 and thereby establish a stable electrical contact between the semiconductor package 70a and a test socket 90.

Figure 7B:
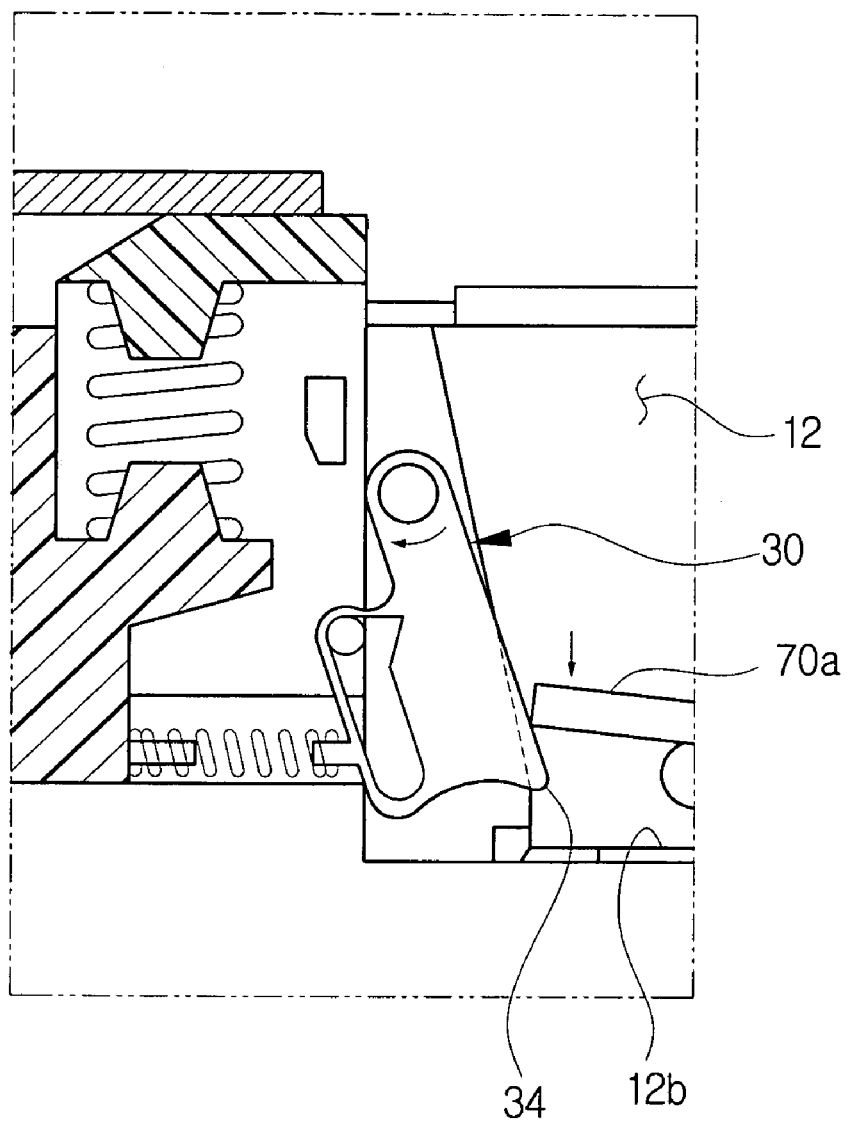

As shown in FIGS. 7A and 7B, the pusher 80 pushes the semiconductor package 70a loaded in the insert 100 towards the test socket 90 to establish a stable electrical contact between the semiconductor package 70a and the test socket 90.

Figure 7C:
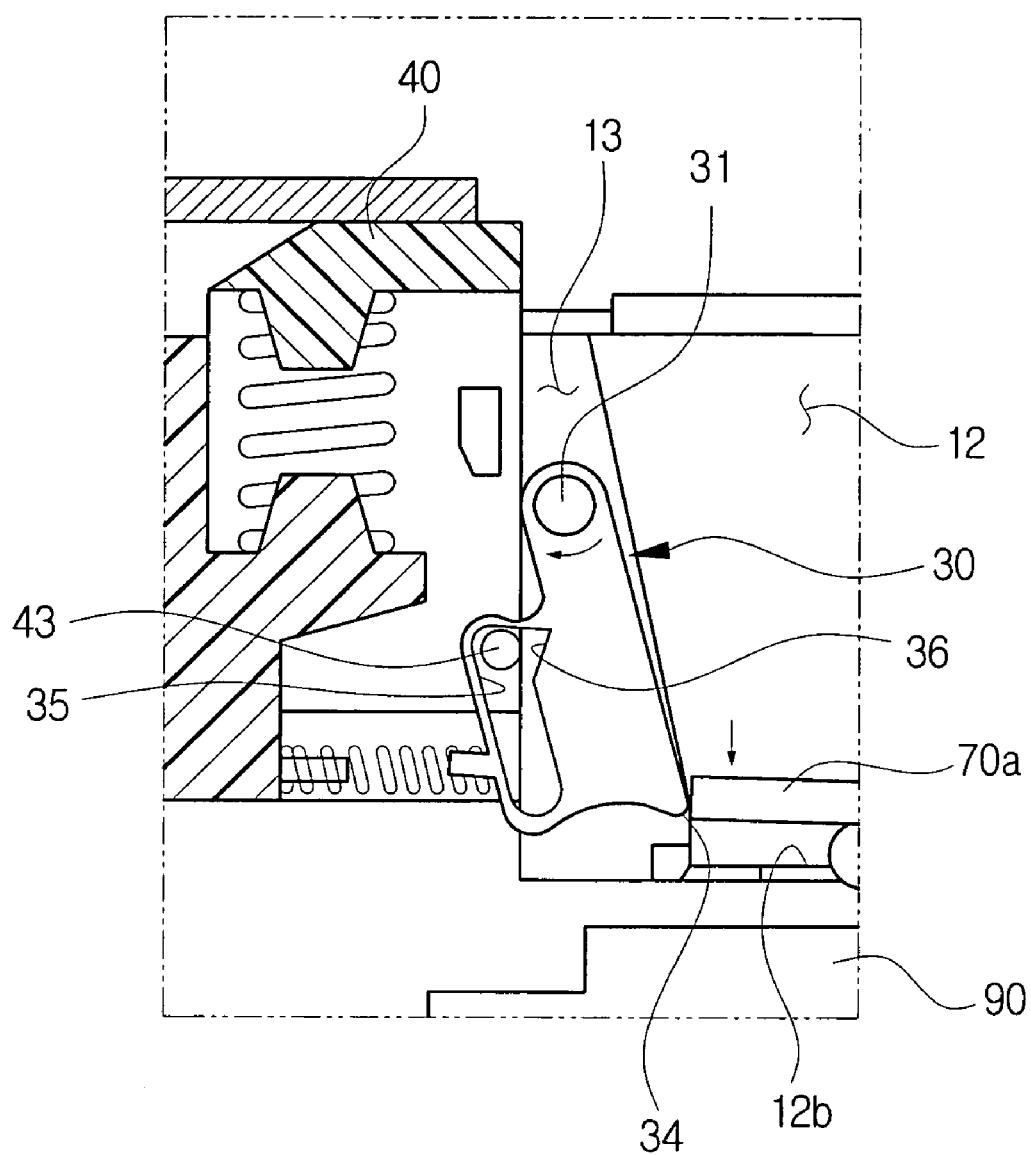
Figure 7D:
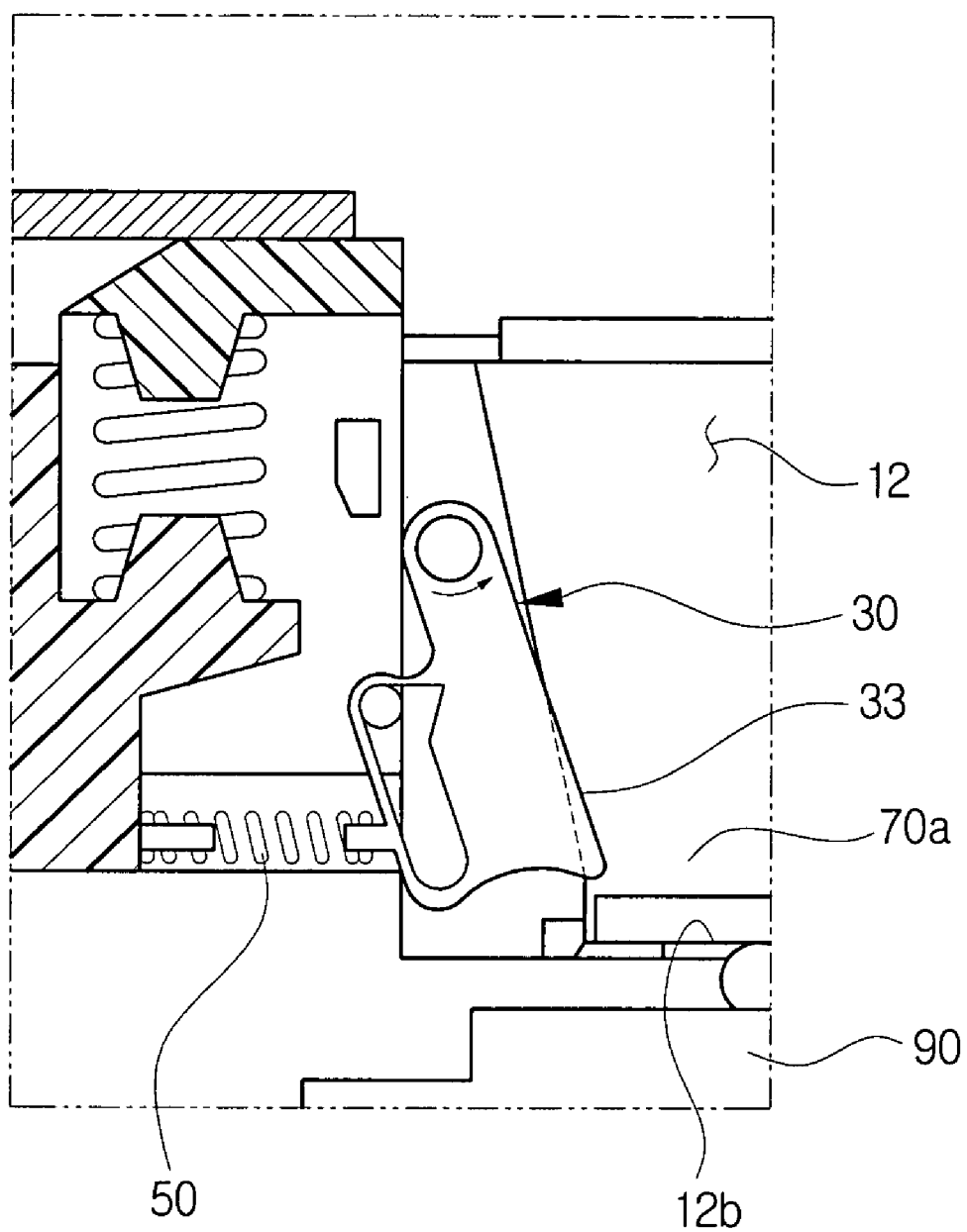

Each latch 30 of the insert 100 according to the present example embodiment is independently movable in response to a pressurizing force directly applied to the latch 30. As shown in FIGS. 7C and 7D, the misloaded semiconductor package 70a can be loaded on the load base 12b of the pocket 12 by the pusher 80 without damage by applying the pressurizing force.

As shown in FIG. 7C, the pressurizing force from the pusher 80 may be applied to the semiconductor package 70a caught on the pressurizing portion 34 of a latch 30. If the pressurizing force transferred to the latch 30 is stronger than an elastic force of the third spring 50, the latch 30 will be pushed into the latch installation groove 13, such that the caught part of the semiconductor package 70a moves onto the load base 12b of the pocket 12. As the latch 30 is rotated around the fixed shaft pin 31 and moved into the latch installation groove 13, the moving shaft pin 43 coupled to the associated button 40 may not move, however, the location of the moving shaft pin 43 in the latch 30 may change from the upper end of the guide hole 35 to the guide hole correction space 36 as the third spring 50 coupled to the latch 30 is compressed.

As shown in FIG. 7D, after the misloaded semiconductor package 70a is loaded on the load base 12b of the pocket 12, the latch 30 protrudes into the pocket 12 and over the semiconductor package 70a due to the elastic force accumulated in the third spring 50.

To load the misloaded semiconductor package 70a on the load base 12b of the pocket 12, the corresponding latch 30 must be opened and closed. To open the latch 30, a force for compressing the third spring 50 may be needed, such as a force for pressing down a button coupled to an associated latch. Alternatively, the latch 30 can be opened and closed using a weaker pressurizing force as described above with respect to FIG. 7C.

In addition, because the front surface 33 of each latch 30 is slanted downwards towards the center of the pocket 12, the semiconductor package 70a can be easily moved to the load base 12b using a pressurizing force applied by the descending pusher 80.

Accordingly, even if the misloaded semiconductor package 70a is a soft type, the semiconductor package 70a can be loaded without damage onto the load base 12b of the pocket 12, thereby establishing a stable electrical contact between the semiconductor package 70a and the test socket 90.

Figure 8:
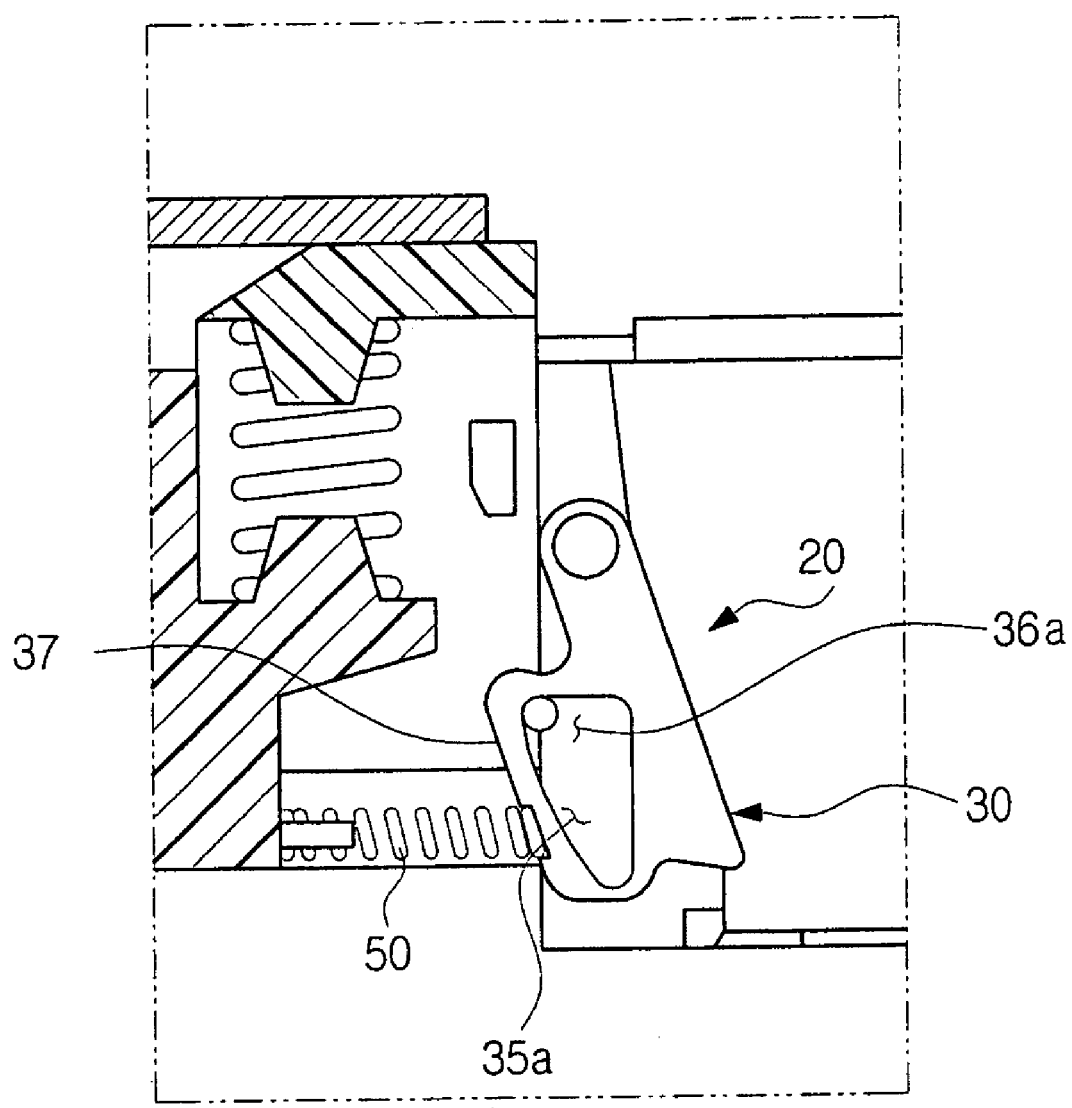
FIG. 8 is another example embodiment of the latch portion 'A' of the insert of FIG. 5A.

FIG. 8 illustrates an alternate example embodiment of the latch portion 20 illustrated in FIG. 5A. The alternate embodiment of the latch units 20 may be distinguishable from the previous embodiment by the different shape and size of the guide hole 35a and the guide hole correction space 36a. In this alternate example embodiment, the guide hole 35a occupies a larger portion of the latch 20, and the guide hole correction space 36a is not limited to a triangular groove in the upper region of the guide hole 35a, instead extending to a uniform edge. Namely, together the guide hole 35a and guide hole correction space 36a have a triangular shape with rounded corners. The base of the triangle extending from the back surface towards the front surface of the latch.

As apparent from the above description, the present invention provides an insert having an independently movable latch mechanism wherein each latch includes a guide hole correction space which is formed as part of a guide hole in the latch. The guide hole in conjunction with a guide member disposed therein guides movement of the latch. An elastic body provides an elastic force to the latch so as to protrude a pressurizing portion of the latch into the pocket. As a result, the latch can be operated independently of an associated button to open and close the pocket when a pressurizing force is directly applied to the latch. Thus, a pusher can push down a semiconductor package misloaded in the pocket, open the latch, and stably load the semiconductor package on a load base of the pocket.

In addition, because the latch can be opened with a pressurizing force just strong enough to compress the elastic spring, a soft semiconductor package is not damaged from pushing the latch.

While example embodiments of the invention have been shown and described in this specification, it will be understood by those skilled in the art that various changes or modifications of the embodiments are possible without departing from the spirit of the invention.

What is claimed is:

1. An insert having an independently movable latch mechanism for loading a semiconductor package, comprising: an insert body having a pocket; latch units installed at opposite sides of the pocket, the latch units for preventing a loaded semiconductor package from escaping out of the pocket; and a press plate elastically installed above the insert body, the press plate operating the latch units by movement relative to an upper surface of the insert body; each of the latch units including, a latch movably connected to the insert body near to the pocket such that a first end of the latch is rotatable around a fixed shaft pin and a second end is movable into and out of the pocket at a lower portion of the pocket, the latch having an front surface slanted downwards towards the center of the pocket and a guide hole near to a back surface, which is opposite to the front surface; a button connected with the latch through a moving shaft pin, the moving shaft pin being rotatably located in the guide hole parallel to the fixed shaft pin, the button being elastically coupled between the latch and the press plate, the button projecting upwards from the insert body and converting movement of the press plate into rotational movement of the latch by causing movement of the moving shaft pin along the guide hole such that the latch rotates about the fixed shaft pin, and the guide hole including a guide hole correction space that permits movement of the latch towards the moving shaft pin such that the latch rotates about the fixed shaft pin independent of the movement of the press plate; and an elastic body disposed between the back surface of the latch and the insert body; the elastic body applying an elastic force to the latch so as to protrude the second end of the latch into the pocket.

2. The insert of claim 1, wherein the guide hole is slanted at an angle corresponding to the front surface of the latch and is longer than a moving distance of the moving shaft pin, and the moving shaft pin is in contact with an upper end of the guide hole when no pressurizing force is applied to the press plate.

3. The insert of claim 2, wherein the guide hole correction space extends from the upper end of the guide hole towards the pocket.

4. The insert of claim 3, wherein the guide hole correction space has a size large enough to permit independent movement of the latch without interference from the moving shaft pin.

5. The insert of claim 4, wherein the moving shaft pin moves between the upper and lower ends of the guide hole according to an application of a pressurizing force to the press plate, thereby rotationally moving the latch.

6. The insert of claim 4, wherein the guide hole correction space is large enough for the latch to be moved to a location permitting opening of the pocket.

7. The insert of claim 6, wherein the elastic body is a coil spring.

8. The insert of claim 6, wherein the elastic body has a modulus of elasticity less than that of the elastic coupling between the button and the latch.

9. The insert of claim 6, wherein the elastic body includes a compression coil spring coupled to a guide pin.

10. The insert of claim 1, wherein the guide hole correction space extends from the upper end of the guide hole towards the pocket, and the guide hole correction space has a size large enough to permit independent movement of the latch without interference from the moving shaft pin.

11. The insert of claim 1, wherein the elastic body disposed between the back surface of the latch and the insert body biases the moving shaft pin away from the guide hole correction space.

12. The insert of claim 11, wherein the elastic body has a modulus of elasticity less than that of the elastic coupling between the button and the latch.

13. The insert of claim 1, wherein the guide hole has a long oval shape extending from inside the first end to inside the second end.

14. The insert of claim 1, wherein the guide hole extends along the back surface.

15. The insert of claim 14, wherein the guide hole correction space extends towards the pocket.

16. The insert of claim 15, wherein the guide hole correction space has a triangle shape.

17. The insert of claim 15, wherein the guide hole and guide hole correction space form a triangle shape.

18. The insert of claim 17, wherein triangle shape has rounded corners.

19. The insert of claim 17, wherein the base of the triangle shape extends from the back surface to the front surface.

* * * * *